United States Patent [19]
Kawasaki

[11] Patent Number: 6,057,715
[45] Date of Patent: *May 2, 2000

[54] CLOCK SIGNAL GENERATING CIRCUIT FOR GENERATING A CLOCK SIGNAL HAVING AN ARBITRARY FREQUENCY

[75] Inventor: Toshio Kawasaki, Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/604,426

[22] Filed: Feb. 21, 1996

[30]     Foreign Application Priority Data

Sep. 13, 1995  [JP]  Japan .................................. 7-235055

[51] Int. Cl.⁷ .................................................. H03B 21/00
[52] U.S. Cl. .......................... 327/106; 327/159; 327/160; 327/291
[58] Field of Search ................................... 327/105–107, 327/113–118, 164, 291, 295, 299

[56]                    References Cited

U.S. PATENT DOCUMENTS

| 4,192,007 | 3/1980 | Becker ..................................... | 327/106 |
| 4,346,448 | 8/1982 | Insam et al. ............................ | 327/106 |
| 4,398,275 | 8/1983 | Zehner .................................... | 367/137 |
| 4,484,296 | 11/1984 | Treise et al. ............................ | 327/106 |
| 4,901,027 | 2/1990 | Kitayoshi ................................ | 327/135 |
| 5,329,253 | 7/1994 | Ichihara .................................. | 327/105 |
| 5,382,913 | 1/1995 | Carson et al. .......................... | 327/105 |

FOREIGN PATENT DOCUMENTS

| 444650A | 9/1991 | European Pat. Off. ................ | 327/106 |
| 3-250814 | 11/1991 | Japan . | |

*Primary Examiner*—Kenneth B. Wells
*Attorney, Agent, or Firm*—Staas & Halsey LLP

[57]                    ABSTRACT

A clock signal generating circuit generates a clock signal having a frequency other than frequencies obtained by dividing a predetermined frequency by natural numbers without using a PLL circuit. An oscillator generates a reference clock signal having a reference frequency. A counter counts the reference clock signal to divide the reference frequency of the reference clock signal. A count value output from the counter is reset when the count value reaches a predetermined number. Sine-wave data of a sine-wave is output when the count value is input, a set of the sine-wave data being output for successive numbers of the count value from zero to the predetermined number. The set of the sine-wave data corresponds to a predetermined number of waves of the sine-wave. A digital-to-analog converter converts the set of the sine-wave data into an analog sine-wave signal. A filter selectively filters a predetermined frequency component contained in the analog sine-wave signal. A comparator converts the analog sine-wave signal into a clock signal.

13 Claims, 12 Drawing Sheets

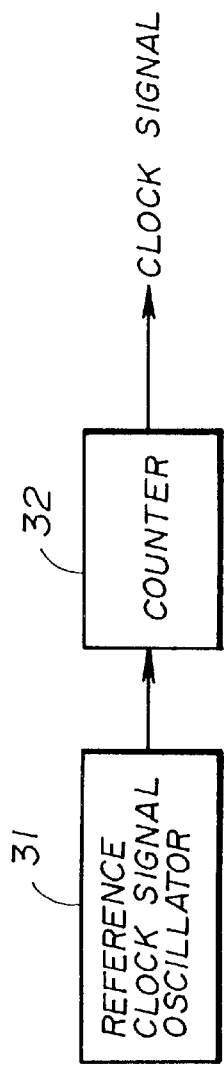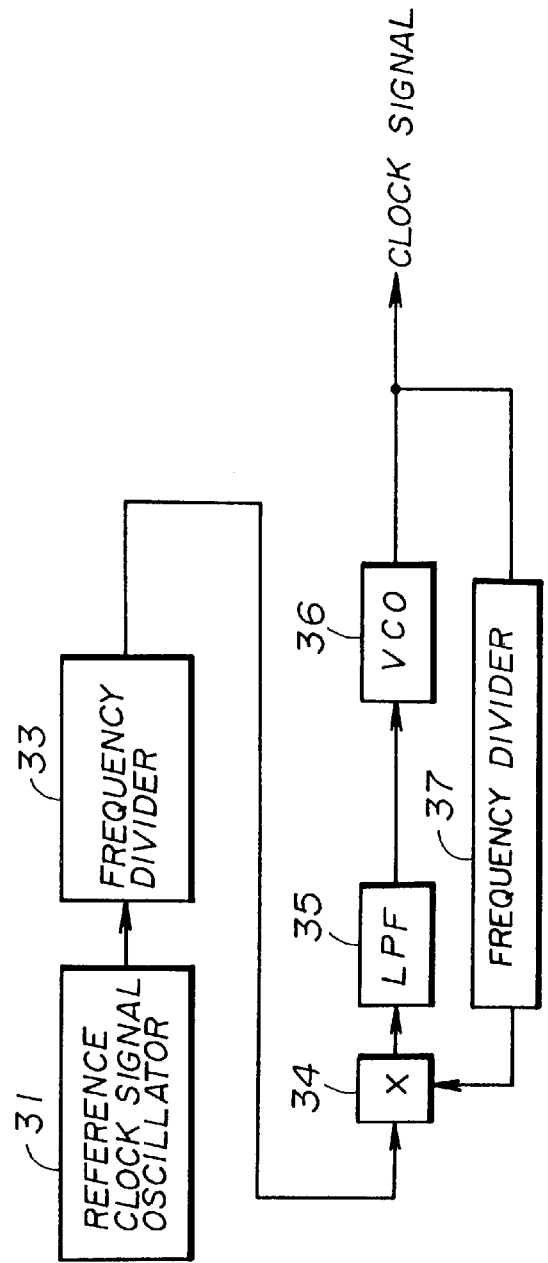

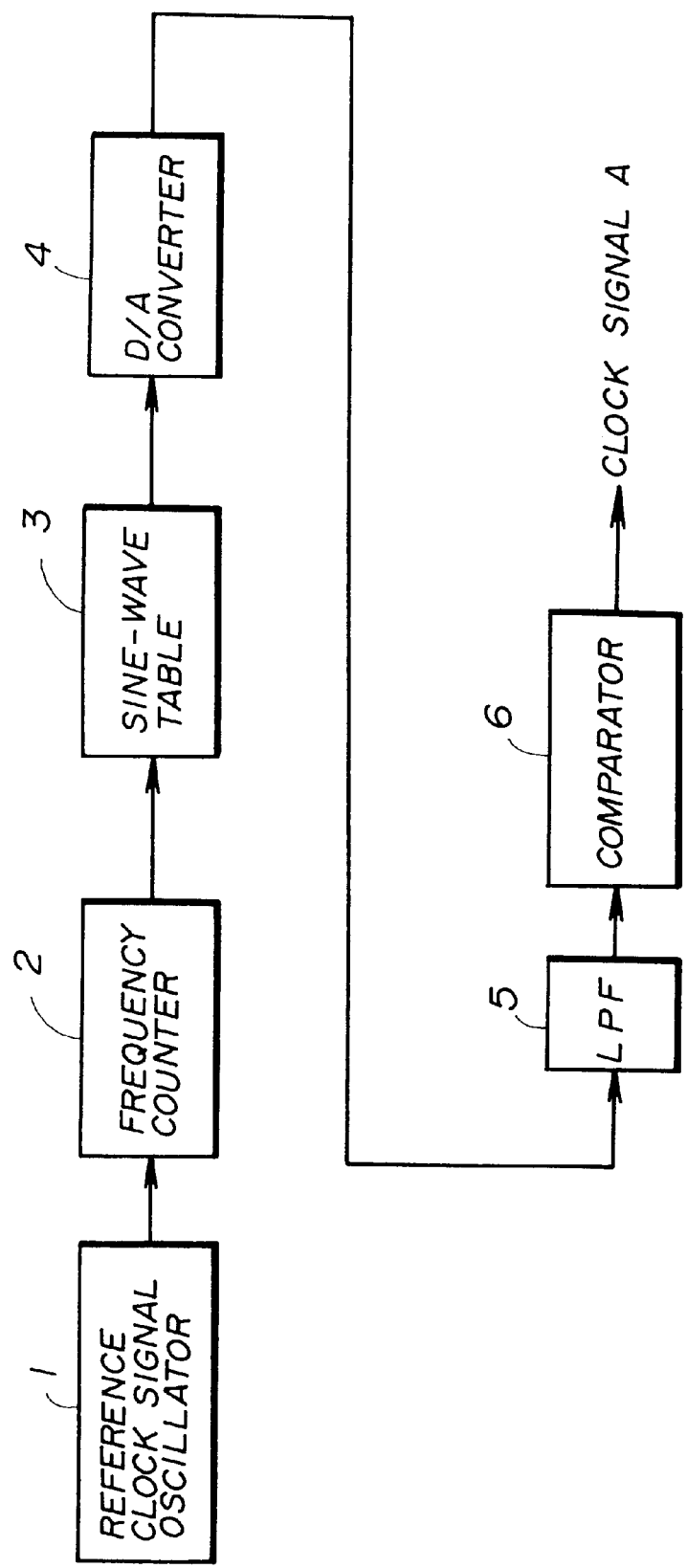

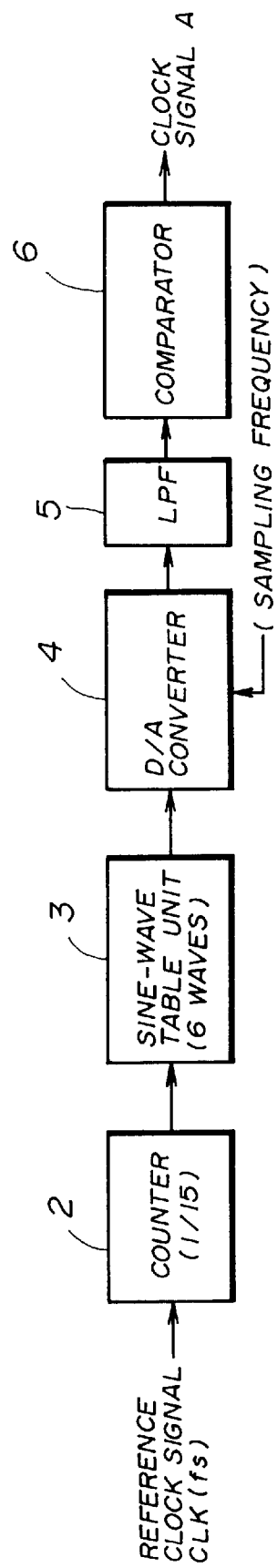

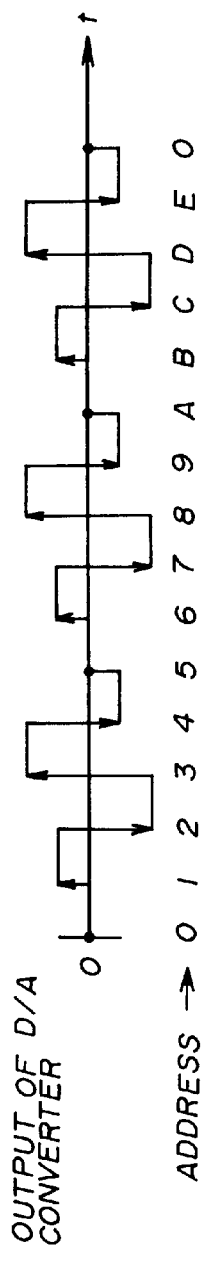
FIG. 5B  OUTPUT CODE OF COUNTER (ADDRESS OF SINE-WAVE TABLE)
FIG. 5C  OUTPUT CODE OF SINE-WAVE TABLE UNIT (8-BIT) : $\{(\sin(2\pi \frac{6}{15} \times ADDRESS)-1) \div 2\} \times 255$
FIG. 5D  OUTPUT OF D/A CONVERTER
FIG. 5E  SPECTRUM OF OUTPUT OF D/A CONVERTER

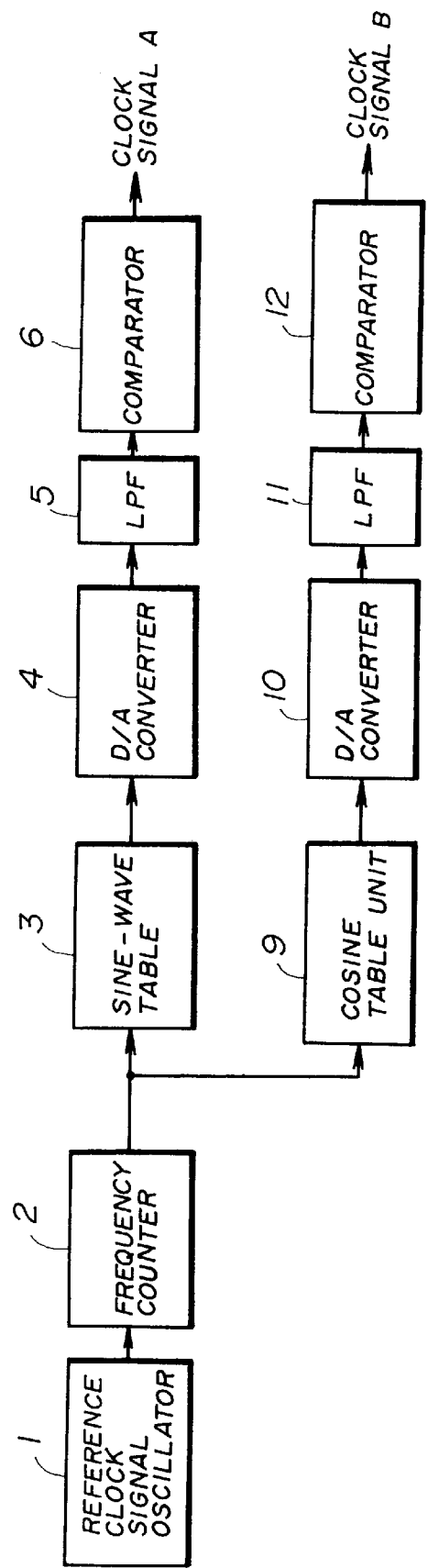

CLOCK SIGNAL GENERATING CIRCUIT FOR GENERATING A CLOCK SIGNAL HAVING AN ARBITRARY FREQUENCY

BACKGROUND OF THE INVENTION

1. Field of the Invention

The present invention generally relates to a clock signal generating circuit and, more particularly, to a clock signal generating circuit which generates a clock signal having a desired frequency by dividing a reference clock signal.

Recently, digital signal technology is widely used in the communication field to transmit information by a digital signal. Since there are various signal speeds for transmitting digital signals, various clock signals having different frequencies are needed. Especially, in the communication field, importance of a change of the signal speed and clock change is increased. Thus, the need for clock signals having various frequencies is increasing.

2. Description of the Related Art FIG. 1 is a block diagram of a conventional clock signal generating circuit. In the clock signal generator shown in FIG. 1, a reference clock signal is generated by a reference clock signal oscillator 31.

The reference clock signal is supplied to a counter 32. A frequency of the reference clock signal is divided in the counter 32 so as to convert the reference clock signal into a clock signal having a desired frequency. In the conventional clock signal generating circuit, only a clock signal having a multiple of the frequency of the reference clock signal can be generated.

In order to generate a clock signal having a frequency other than a multiple of the frequency of the reference clock signal, a clock signal generating circuit using a phase locked loop (PLL) circuit is used. FIG. 2 is a block diagram of a clock signal generating circuit using the PLL circuit. In FIG. 2, the reference clock signal generated by the reference clock signal oscillator 31 is supplied to a frequency divider 33. The frequency of the reference clock signal is divided by a predetermined dividing ratio by the frequency divider 33. A phase comparator 34 outputs a phase difference signal by comparing the clock signal output from the frequency divider 33 with a clock signal output from the clock signal generating circuit. The phase difference signal is filtered by a low-pass filter (LPF) 35, and the filtered phase difference signal is supplied to a voltage controlled oscillator (VCO) 36. The voltage controlled oscillator 36 varies a control voltage in accordance with the phase differential signal supplied by the low-pass filter 35. A frequency of a clock signal oscillated by the voltage controlled oscillator 36 is varied responsive to the control signal.

In the clock signal generating circuit shown in FIG. 2, the dividing ratio of the frequency divider 37 is set to a predetermined value in relation to the dividing ratio of the frequency divider 33 so that the same frequency is obtained by the frequency dividers 33 and 37. That is, the frequency of the clock signal output from the frequency divider 37 is controlled to be equal to the frequency of the clock signal output from the frequency divider 33.

The clock signal generating circuit shown in FIG. 2 can generate a clock signal having a frequency other than the frequency divided by a natural number due to the PLL circuit. However, a multiplication order of the PLL circuit may be increased due to values of the dividing ratios of the frequency dividers 33 and 37. Thus, there is a problem in that a phase noise characteristic is deteriorated or a pull-in time of a synchronization of the PLL circuit is increased.

SUMMARY OF THE INVENTION

It is a general object of the present invention to provide an improved and useful clock signal generating circuit in which the above-mentioned problems are eliminated.

A more specific object of the present invention is to provide a clock signal generating circuit which can generate a clock signal having a frequency other than frequencies obtained by dividing a predetermined frequency by natural numbers without using a PLL circuit.

In order to achieve the above-mentioned objects, there is provided according to the present invention a clock signal generating circuit for generating at least one clock signal from a reference clock signal having a predetermined reference frequency, the clock signal generating circuit comprising:

an oscillator generating the reference clock signal;

a counter counting the reference clock signal to divide the reference frequency of the reference clock signal so that a count value output from the counter is reset when the count value reaches a predetermined number;

sine-wave data generating means for outputting sine-wave data of a sine-wave when the count value is input, a set of the sine-wave data being output for successive numbers of the count value from zero to the predetermined number, the set of the sine-wave data corresponding to a predetermined number of waves of the sine-wave;

a digital-to-analog converter converting the set of the sine-wave data into an analog sine-wave signal;

a filter selectively filtering a predetermined frequency component contained in the analog sine-wave signal output from the digital-to-analog converter; and a comparator converting the analog sine-wave signal output from the filter into a clock signal.

According to the present invention, the reference frequency of the reference clock signal is divided by the predetermined number by the counter. The set of sine-wave data is output for each period of the divided frequency. Since the set of sine-wave data corresponds to the predetermined number of waves, the set of the sine-wave data output from the sine-wave data outputting means is converted into the analog sine-wave signal having a frequency determined by the predetermined number of the count value and the predetermined number of waves corresponding to the set of the sine-wave data.

In the clock signal generating circuit according to the present invention, the sine-wave data generating means may store the set of the sine-wave data as table information so that each sine-wave data is designated by a corresponding count value output from the counter. The filter may eliminate a folding frequency component contained in the analog sine-wave signal. In an alternative case, the filter may selectively extract a folding frequency component contained in the analog sine-wave signal. Additionally, the predetermined number of the count value and the predetermined number of waves may be changed by a switch signal supplied by an external device.

Additionally, the clock signal generating circuit may further comprise:

cosine-wave data generating means for outputting cosine-wave data of a cosine-wave when the count value is input, a set of the cosine-wave data being output for successive numbers of the count value from zero to the predetermined number, the set of the cosine-wave data corresponding to a predetermined number of waves of the cosine-wave;

a second digital-to-analog converter converting the set of the cosine-wave data into an analog cosine-wave signal;

a second filter selectively filtering a predetermined frequency component contained in the analog cosine-wave signal output from the second digital-to-analog converter; and a second comparator converting the analog sine-wave signal output from the second filter into the clock signal.

The clock signal obtained by the cosine-wave data generating means has a 90 degrees phase shift from the clock signal obtained by the sine-wave data generating means. That is, two clock signals have phases shifted 90 degrees from each other which are generated at the same time.

The sine-wave data generating means may store the set of the sine-wave data as table information so that each sine-wave data is designated by a corresponding count value output from the counter. Similarly, the cosine-wave data generating means may store the set of the cosine-wave data as table information so that each cosine-wave data is designated by a corresponding count value output from the counter.

The filter and the second filter may eliminate a folding frequency component contained in the analog sine-wave signal and the analog cosine-wave signal, respectively. In an alternative case, the filter and the second filter may selectively extract a folding frequency component contained in the analog sine-wave signal and the analog cosine-wave signal, respectively. Additionally, the predetermined number of the count value and the predetermined number of waves may be changed by a switch signal supplied by an external device.

In an alternative case of the clock signal generating circuit having the cosine-wave data generating means, the clock signal generating circuit according to the present invention may further comprise:

second sine-wave data generating means for outputting second sine-wave data of a second sine-wave when the count value is input, a set of the second sine-wave data being output for successive numbers of the count value from zero to the predetermined number, the set of the second sine-wave data corresponding to a predetermined number of waves of the second sine-wave;

a second digital-to-analog converter converting the set of the second sine-wave data into a second analog sine-wave signal;

a second filter selectively filtering a predetermined frequency component contained in the second analog sine-wave signal output from the second digital-to-analog converter;

a second comparator converting the second analog sine-wave signal output from the second filter into a second clock signal; and offset adding means for adding an offset value to the count value input to the second sine-wave data generating means.

The clock signal obtained by the second sine-wave data generating means has a phase shifted by a predetermined number of degrees from the clock signal obtained by the sine-wave data generating means. That is, two clock signals having phases shifted 90 degrees from each other are generated at the same time.

The sine-wave data generating means stores the set of the sine-wave data as table information so that each sine-wave data is designated by a corresponding count value output from the counter. Similarly, the second sine-wave data generating means stores the set of the second sine-wave data as table information so that each second sine-wave data is designated by a corresponding count value output from the counter.

The filter and the second filter eliminate a folding frequency component contained in the analog sine-wave signal and the second analog sine-wave signal, respectively. In an alternative case, the filter and the second filter may selectively extract a folding frequency component contained in the analog sine-wave signal and the second analog sine-wave signal, respectively. Additionally, the predetermined number of the count value and the predetermined number of waves are changed by a switch signal supplied by an external device.

Other objects, features and advantages of the present invention will become more apparent from the following detailed description when read in conjunction with the accompanying drawings.

BRIEF DESCRIPTION OF THE DRAWINGS

FIG. 1 is a block diagram of a conventional clock signal generating circuit;

FIG. 2 is a block diagram of a conventional clock signal generating circuit using a PLL circuit;

FIG. 3 is a block diagram of a clock signal generating circuit according to a first embodiment of the present invention;

FIG. 5A is a part of a block diagram shown in FIG. 4; FIG. 5B is an illustration of output codes of a counter shown in FIG. 5A; FIG. 5C is an illustration of output codes of a sine-wave table unit shown in FIG. 5A; FIG. 5D is an illustration of an output of the sine-wave table unit; FIG. 5E is spectrum of the output of the D/A converter shown in FIG. 5A;

FIG. 6 is a block diagram of a clock signal generating circuit according to a second embodiment of the present invention;

DETAILED DESCRIPTION OF THE PREFERRED EMBODIMENTS

Figure 4:
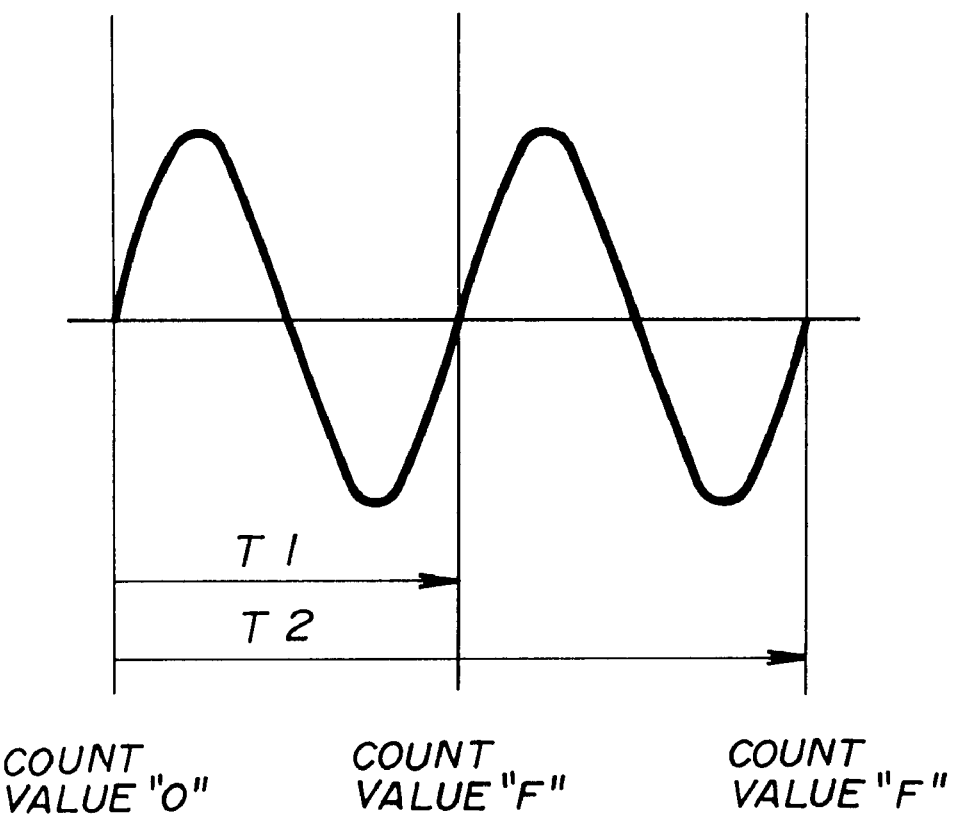
FIG. 4 is an illustration for explaining a relationship between a count value and a set of sine-wave data output from a sine-wave table unit shown in FIG. 3.

A description will now be given of a clock signal generating circuit according to a first embodiment of the present invention. FIG. 3 is a block diagram of the clock signal generating circuit according to the first embodiment of the present invention.

The clock signal generating circuit shown in FIG. 3 comprises a reference clock signal oscillator 1, a counter 2, a sine-wave table unit 3, a digital to analog (D/A) converter 4, a low-pass filter 5 and a comparator 6. The reference clock signal oscillator 1 generates a reference clock signal having a predetermined frequency. The counter 2 generates and outputs a count value by dividing the frequency of the reference clock signal. The sine-wave table unit 3 stores a set of sine-wave data corresponding to a predetermined number of periods of a sine-wave, and outputs a sine-wave data signal. The D/A converter 4 converts the sine-wave data signal output from the sine-wave table unit 3 into an analog sine-wave signal. The low-pass filter 5 eliminates a folding frequency component from the analog sine-wave signal output from the A/D converter 4. The comparator 6 converts the analog sine-wave signal output from the low-pass filter 5 into a clock signal A.

More specifically, in the clock signal generating circuit shown in FIG. 3, the reference clock output from the reference clock signal oscillator 1 is counted up to a predetermined count number by the counter 2. The counter 2 outputs a count value to the sine-wave table unit 3. The sine-wave table unit 3 reads out the sine-wave data stored therein in accordance with the count value input from the counter 2. The sine-wave table unit 3 stores a set of sine-wave data in the form of table information. The count value output from the counter 2 is used as address information when the table information is referred to.

FIG. 4 is an illustration explaining a relationship between the count value and a set of sine-wave data output from the sine-wave table unit 3. It is assumed that the counter 2 counts up to "F". If a set of sine-wave data corresponding to a single period T1 of a sine-wave is stored in the sine-wave table unit 3, the set of sine-wave data corresponding to a single period T1 of the sine-wave is output from the sine-wave table unit 3. If a set of sine-wave data corresponding to a single period T2 of the sine-wave is stored in the sine-wave table unit 3, the set of sine-wave data corresponding to a single period T2 of the sine-wave is output from the sine-wave table unit 3.

Accordingly, if a dividing ratio of the counter 2 is set to "M" and a number of waves corresponding to the set of sine-wave data stored in the sine-wave table unit 3 is set to "N", a frequency of the signal output from the sine-wave table unit 3 is equal to "N/M" times of the frequency of the reference clock signal.

The sine-wave data signal output from the sine-wave table unit 3 is converted into the analog sine-wave signal by the D/A converter 4. Thereafter, a folding frequency component in the waveform of the analog sine-wave signal is eliminated by the low-pass filter 5 so as to shape the analog sine-wave signal. The shaped analog sine-wave signal is input to the comparator 6. The comparator 6 compares the shaped sine-wave signal with a predetermined threshold value, and outputs the clock signal A.

A description will now be given, with reference to FIGS. 5A to 5E, of the details of the operation of the clock signal generating circuit. It is assumed that the clock signal generating circuit generates a frequency which is 6/15 of the frequency (hereinafter referred to as a reference frequency) of the reference clock signal.

In order to divide the reference frequency into 6/15, the maximum count number of the counter 2 is set to 15. A set of the sine-wave data corresponding to six waves (six periods) are stored in the sine-wave table unit 3.

When the reference clock signal CLK is input from the reference clock signal oscillator 1 to the counter 2, an output code of the counter 2 changes as shown in FIG. 5B. The output code from the counter 2 is represented by hexadecimal digits. A single period of the sine-wave corresponds to a series of the output codes from "0" to "E", when the output code is input to the sine-wave table unit 3 as address information. That is, the sine-wave table unit 3 outputs a series of output codes shown in FIG. 5C as the sine-wave data signal in accordance with the output codes from the counter 2. The output codes read out and output from the sine-wave table unit 3 are represented by the following expression (8-bit HEX). That is, the table information stored in the sine-wave table unit 3 is prepared according to the following expression.

$$[\sin\{2\pi=(6/15)=\text{ADDRESS}\}+1]=255/2 \qquad (1)$$

Where ADDRESS is the output code of the counter 2.

For example, if the output code of the counter 2 is "0", the output code of the sine-wave table unit 3 is "80" which is the hexadecimal notation of "128" calculated by the expression (1). If the output code of the counter 2 is "1", the output code of the sine-wave table unit 3 is "CA" which is the hexadecimal notation of "218" calculated by the expression (1). In the same manner, the output code of the sine-wave table unit 3 sequentially changes as "80", "CA", "06", "F8" and "34" when the output code of the counter 2 changes from "0" to "4". The same series of the output codes is output from the sine-wave table unit 3 for each series of five output codes of the counter 2, that is, from "5" to "9" and from "A" to "E". This means that a set of the sine-wave data corresponding to two waves is output from the sine-wave table unit 3 for each series of output codes of the counter 2 from "0" to "4", from "5" to "9" and from "A" to "E". Since there are provided five datum points for two waves, the condition defined by the sampling theorem is satisfied.

Accordingly, by supplying the three series of the five values "80", "CA", "06", "F8" and "34" to the A/D converter 4, the analog sine-wave signal corresponding to six waves is output from the A/D converter 4.

The waveform of the analog sine-wave signal is obtained by a sampling frequency the same as the frequency of the reference clock signal CLK. Thus, as shown by spectrum of the output signal from the A/D converter 4 in FIG. 5D, a folding frequency component is generated at the frequency of $9f_s/15$ which is generated on the opposite side of the frequency $6f_s/15$ with respect to one half of the sampling frequency $f_s/2$, where $f_s$ is the frequency of the reference clock signal CLK. Thus, the folding frequency component is eliminated by the low-pass filter 5, and the sine-wave data signal is converted into a sine-wave with respect to the $6f_s/15$ component. Thereafter, the clock signal A having a square waveform is generated by the comparator 6.

In the present embodiment, the dividing ratio of the counter 2 and the number of waves output from the sine-wave table unit 3 are set to arbitrary values. Thus, a clock signal having an arbitrary frequency can be generated without using a PLL circuit as in the conventional clock signal generating circuit.

A description will now be given, with reference to FIG. 6, of a second embodiment of the present invention. FIG.6 is a block diagram of a clock signal generating circuit according to the second embodiment of the present invention. In FIG. 6, parts that are the same as the parts shown in FIG. 3 are given the same reference numerals, and descriptions thereof will be omitted.

In the clock signal generating circuit shown in FIG. 6, the clock signal A is generated by the same construction as the first embodiment. Additionally, this clock signal generating circuit comprises a cosine-wave table unit 9, a D/A converter 10, a low pass filter 11 and a comparator 12. Those parts together generate a clock signal B. The clock signal B has the same frequency as the clock signal A. The phase of the clock signal B is shifted 90 degrees from the phase of the clock signal A. That is, the clock signal B corresponds to an orthogonal clock signal with respect to the clock signal A.

Specifically, the output of the counter 2 is input to the cosine-wave table unit 9 as well as the sine-wave table unit 3. A set of cosine-wave data is stored in the cosine-wave table unit 9. The set of cosine-wave data is data of a cosine wave which has a phase shifted 90 degrees from the phase of the sine wave whose data is stored in the sine-wave table unit 3. Accordingly, a set of cosine-wave data is output from the cosine-wave table unit 9 in the same manner as the sine-wave table unit 3. The cosine-wave data signal output from the cosine-wave table unit 9 is converted into the analog sine-wave signal by the D/A converter 10. Thereafter, a folding frequency component in the waveform of the analog sine-wave signal is eliminated by the low-pass filter 11 so as to shape the analog cosine-wave signal. The shaped analog cosine-wave signal is input to the comparator 12. The comparator 12 compares the shaped cosine-wave signal with a predetermined threshold value, and outputs the clock signal B.

Figure 7:
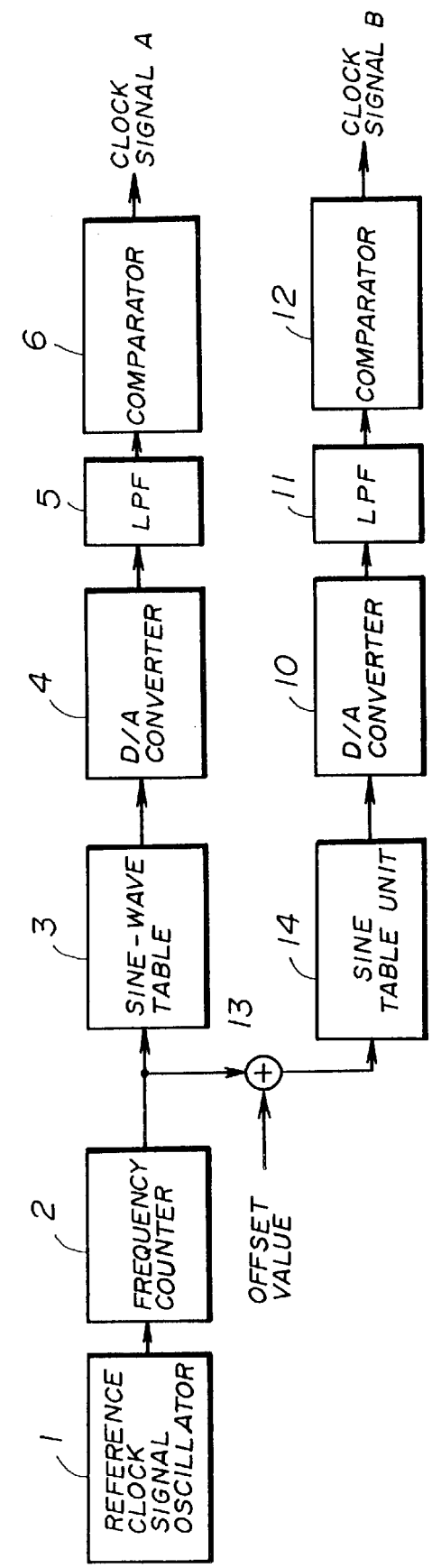
FIG. 7 is a block diagram of a clock signal generating circuit according to a third embodiment of the present invention.

A description will now be given, with reference to FIG. 7, of a third embodiment of the present invention. FIG. 7 is a block diagram of a clock signal generating circuit according to the third embodiment of the present invention. In FIG. 7, parts that are the same as the parts shown in FIG. 6 are given the same reference numerals, and descriptions thereof will be omitted.

In the clock signal generating circuit shown in FIG. 7, a combination of an adder 13 and a sine-wave table unit 14 is used instead of the cosine-wave table unit 9 in the clock signal generating circuit shown in FIG. 6. That is, the output of the counter 2 is supplied to the sine-wave table unit 14 after being provided with an offset value. Accordingly, the sine-wave table unit 14 outputs a set of sine-wave data corresponding to a sine wave having a phase shifted 90 degrees from the phase of the sine wave whose data is stored in the sine-wave table unit 3. The sine-wave data signal output from the sine-wave table unit 14 is converted into the analog sine-wave signal by the D/A converter 10. Thereafter, a folding frequency component in the waveform of the analog sine-wave signal is eliminated by the low-pass filter 11 so as to shape the analog sine-wave signal. The shaped analog cosine-wave signal is input to the comparator 12. The comparator 12 compares the shaped cosine-wave signal with a predetermined threshold value, and outputs a clock signal C.

Accordingly, the clock signal C has a phase shifted from the phase of the clock signal A by a phase difference corresponding to the offset value provided by the adder 13. Thus, the present embodiment can generate two clock signals having different phases, the phase difference being arbitrarily set to a desired value.

Figure 8:
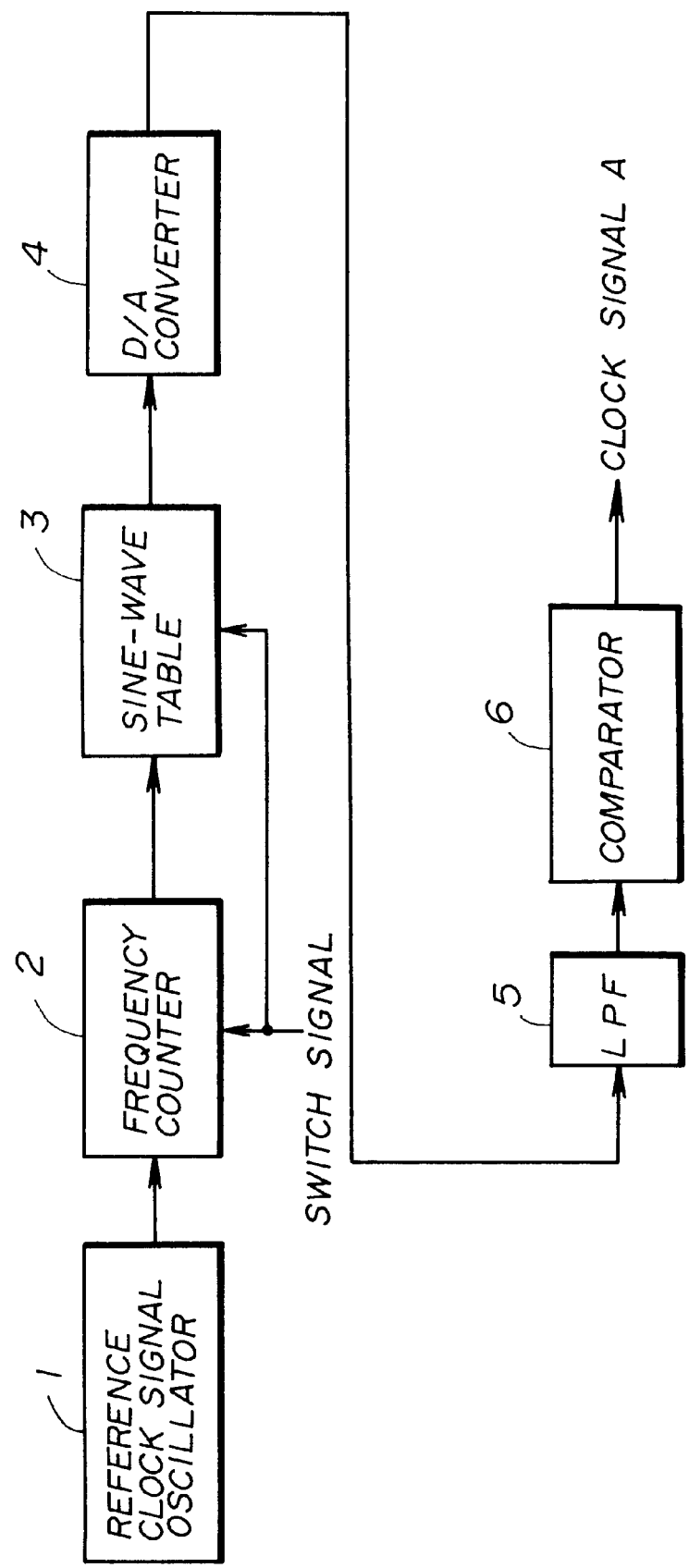
FIG. 8 is a block diagram of a clock signal generating circuit according to a fourth embodiment of the present invention.

A description will now be given, with reference to FIG. 8, of a fourth embodiment of the present invention. FIG. 8 is a block diagram of a clock signal generating circuit according to the fourth embodiment of the present invention. In FIG. 8, parts that are the same as the parts shown in FIG. 3 are given the same reference numerals, and descriptions thereof will be omitted.

The counter 2 of the present embodiment has two dividing ratios. Additionally the sine-wave table unit 3 stores two sets of sine-wave data corresponding to sine waves having different periods. The dividing ratios and the sets of sine-wave data can be switched by an externally supplied switch signal. Thus, the clock frequency determined by the dividing ratio A and the number of waves N can be changed arbitrarily. This allows an arbitrary change in the frequency of the clock signal A.

Figure 9:
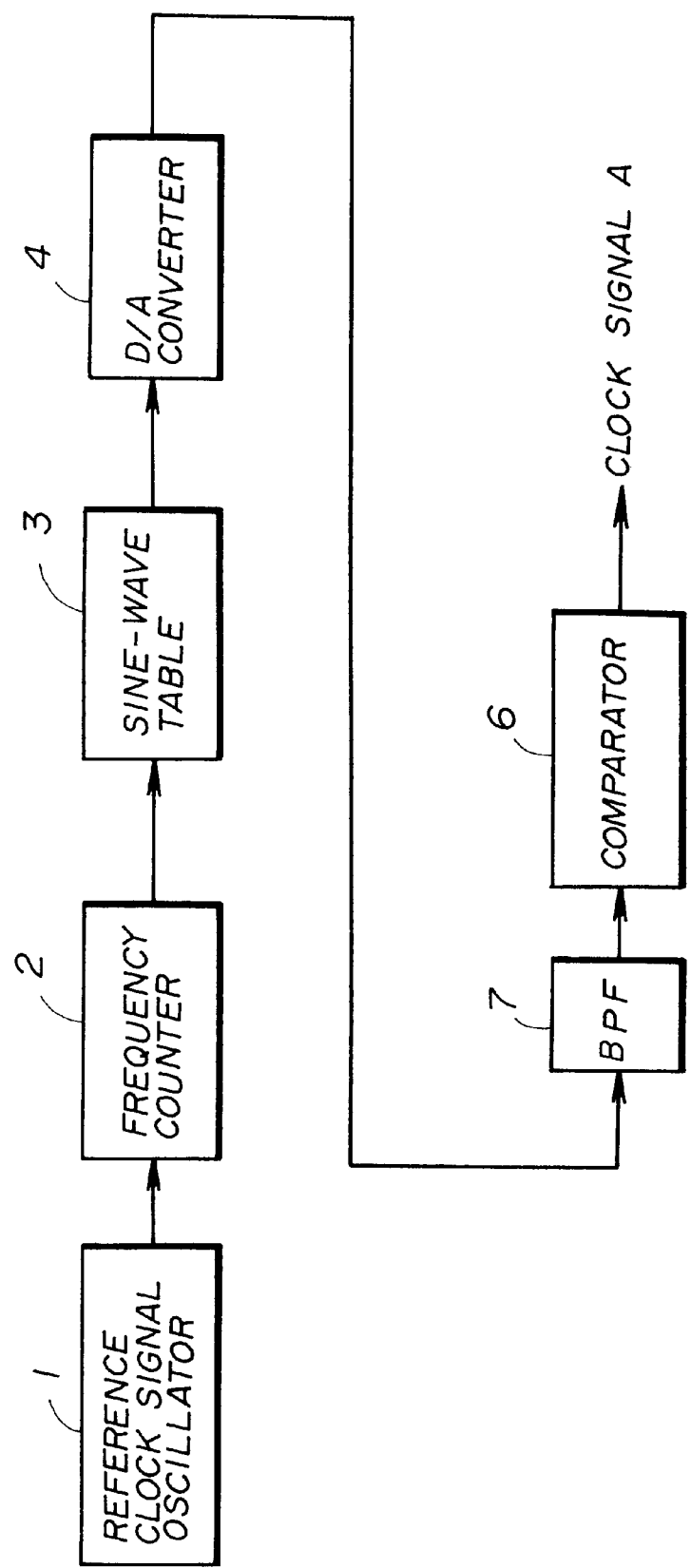
FIG. 9 is a block diagram of a clock signal generating circuit according to a fifth embodiment of the present invention.

A description will now be given, with reference to FIG. 9, of a fifth embodiment of the present invention. FIG. 9 is a block diagram of a clock signal generating circuit according to the fifth embodiment of the present invention. In FIG. 9, parts that are the same as the parts shown in FIG. 3 are given the same reference numerals, and descriptions thereof will be omitted.

The clock signal generating circuit shown in FIG. 9 has the same construction as the clock signal generating circuit shown in FIG. 3 except for the low-pass filter 5 being replaced by a band-pass filter 7. The band-pass filter 7 does not eliminate the folding frequency component but positively extracts the folding frequency component. Accordingly, the clock signal A output from the comparator 6 has a frequency higher than the clock signal A generated by the clock signal generating circuit shown in FIG. 3.

It should be noted that the low-pass filter 5 in the clock signal generating circuits shown in FIGS. 6, 7 and 8 may be replaced by the band-pass filter 7.

Figure 10:
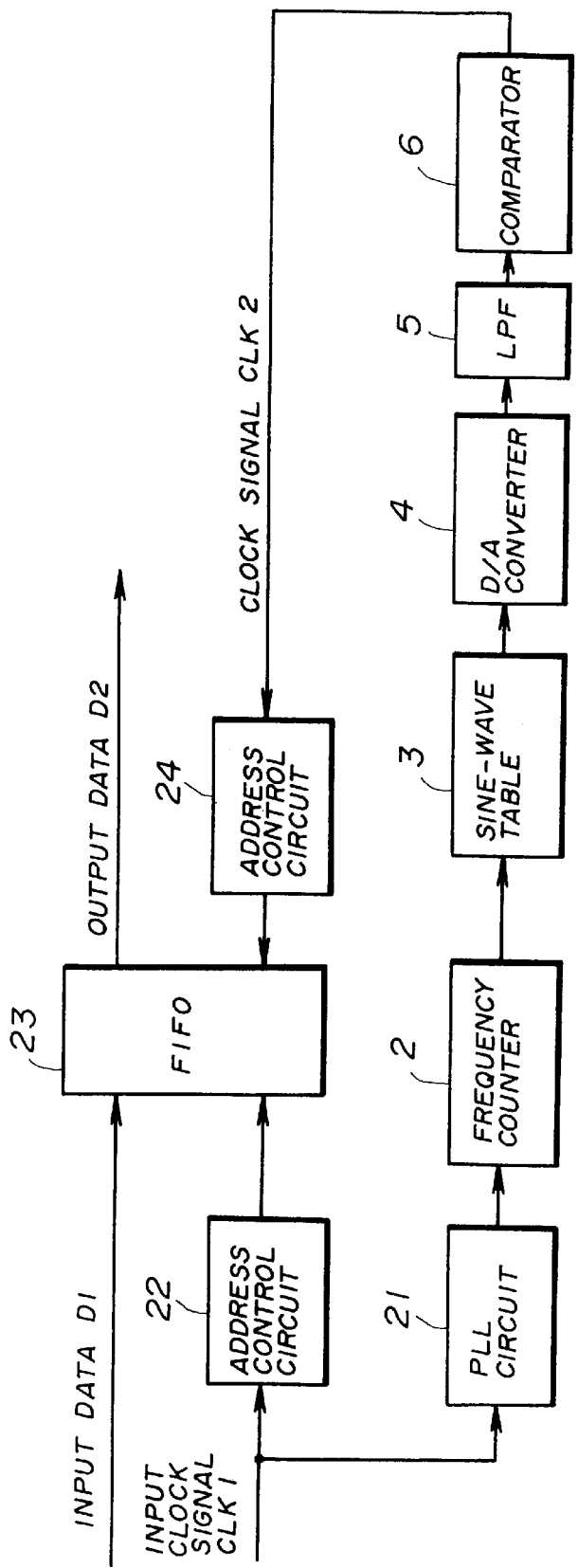
FIG. 10 is a block diagram of a clock buffer circuit in which the clock signal generating circuit shown in FIG. 3 is used.

FIG. 10 is a block diagram of a clock buffer circuit in which the clock signal generating circuit shown in FIG. 3 is used. In FIG. 10, parts that are the same as the parts shown in FIG. 3 are given the same reference numerals, and descriptions thereof will be omitted. The clock buffer circuit shown in FIG. 10 is used as a data speed changing circuit.

Input data D1 and the input clock signal CLK1 are supplied to the clock buffer circuit shown in FIG. 10. The input clock signal CLK1 is supplied to the counter 2 via a PLL circuit 21. The PLL circuit 21 is provided for multiplying a frequency of the input clock signal CLK1. Thus, a clock signal output from the PLL circuit 21 is equivalent to the reference clock signal oscillated by the reference clock signal oscillator 1 shown in FIG. 3. Thus, the clock signal output from the PLL circuit 21 is supplied to the counter 2. The counter 2, the sine-wave table unit 3, the D/A converter 4, the low-pass filter 5 and the comparator 6 together generate a clock signal CLK2 which corresponds to the clock signal A shown in FIG. 3.

The input clock signal CLK1 is also supplied to an address control circuit 22 so as to control a write address of a first-in first-out (FIFO) memory 23 so that input data D1 is stored in the address designated by the address control circuit 22. Additionally, the input clock CLK1 is multiplied by the PLL circuit 21. The signal output from the PLL circuit 21 is used as the reference clock signal. By using the signal output from the PLL circuit 21, the clock signal CLK2 is generated. The clock signal CLK2 is supplied to an address control circuit 24. The address control circuit 24 generates and supplies a read address to the FIFO memory 23 in accordance with the clock signal CLK2. Thus the FIFO memory 23 reads out output data D2 at a changed signal speed corresponding to the frequency of the clock signal CLK2.

Figure 11:
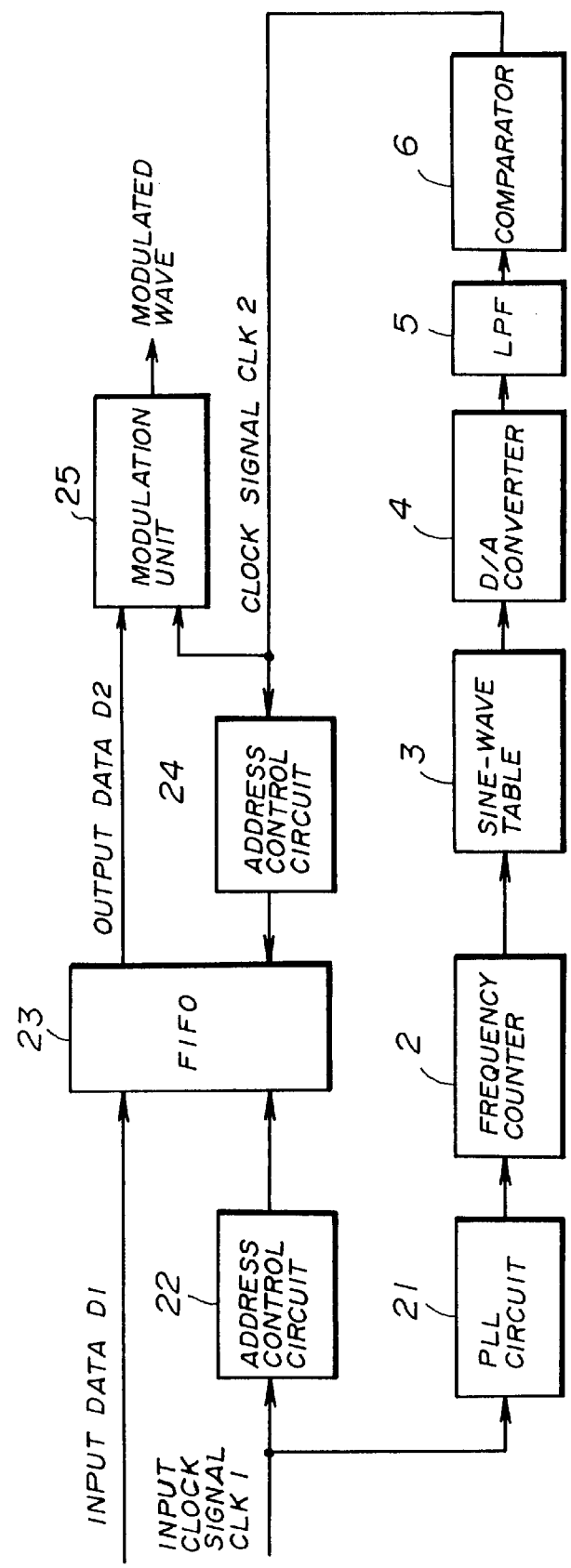
FIG. 11 is a block diagram of a modulator device having the clock buffer circuit shown in FIG. 10.

FIG. 11 is a block diagram of a modulator device having the clock buffer circuit shown in FIG. 10. In FIG. 11, parts that are the same as the parts shown in FIG. 10 are given the same reference numerals, and descriptions thereof will be omitted. The demodulator device shown in FIG. 11 has the same structure as the clock buffer circuit shown in FIG. 10 except for a modulation unit 25 being added.

In the clock buffer circuit shown in FIG. 11, the output data D2 output from the FIFO memory 23 is supplied to the modulation unit 25. The modulation unit 25 modulates the output data D2 in accordance with the clock signal CLK2 supplied by the comparator 6. That is, the clock signal CLK2, a frequency of which may be a multiplication of the frequency of the input clock signal CLK1, is used for modulating the output data D2.

Figure 12:
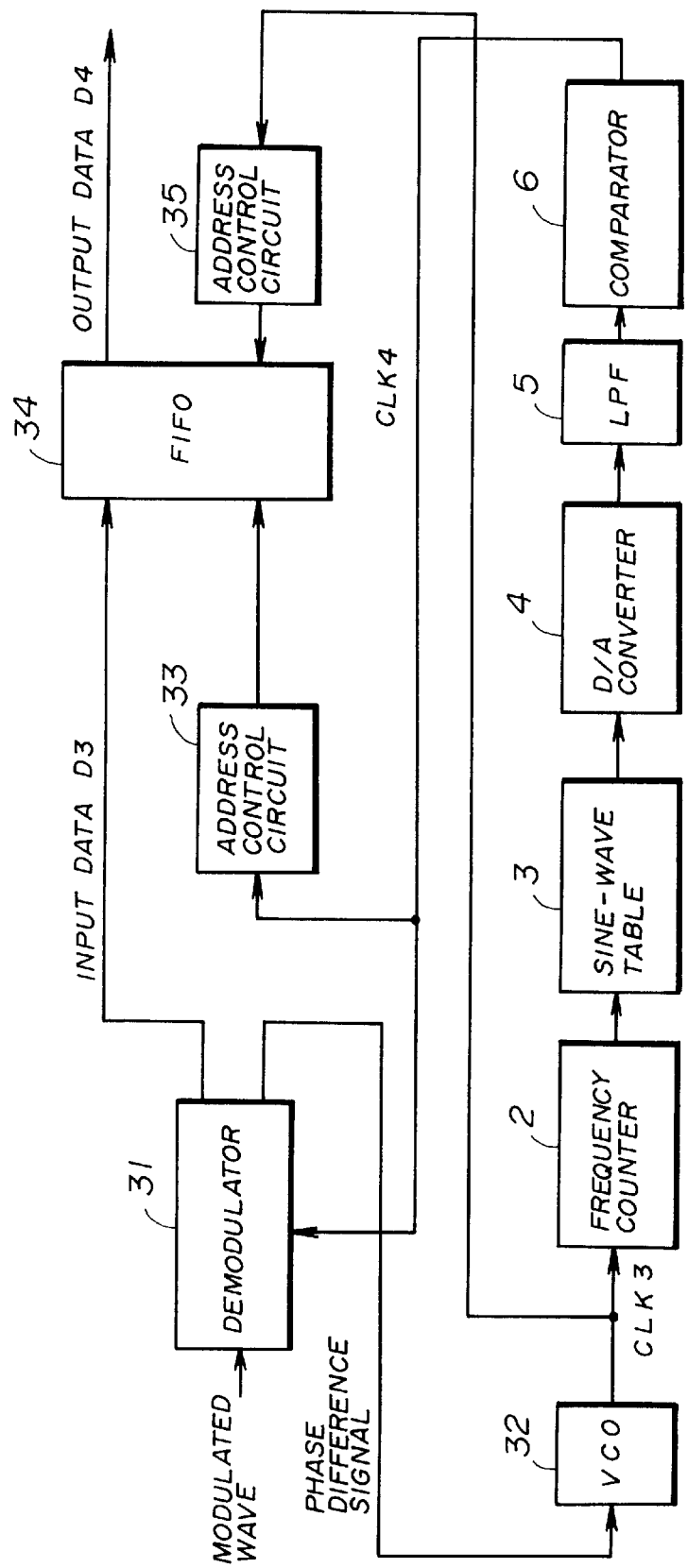
FIG. 12 is a block diagram of a demodulator device corresponding to the modulator device shown in FIG. 11.

FIG. 12 is a block diagram of a demodulator device corresponding to the modulator device shown in FIG. 11. In FIG. 12, parts that are the same as the parts shown in FIG. 11 are given the same reference numerals, and descriptions thereof will be omitted. The demodulator device shown in FIG. 12 demodulates the modulated wave transmitted from the modulator device shown in FIG. 11.

The modulated wave is input to a demodulation unit 31. The demodulator device demodulates the modulated wave to generate input data D3 and a phase difference signal. The phase difference signal is generated based on the modulated wave and a clock signal CLK4 output by the comparator 6. The phase difference signal is supplied to a voltage controlled oscillator (VCO) 32. The voltage controlled oscillator 32 generates and outputs a clock signal CLK3 in accordance with the phase difference signal. The clock signal CLK3 is supplied to the counter 2 as the reference clock signal. The clock signal CLK4 is generated in the previously mentioned manner, and is output from the comparator 6. The clock signal CLK4 is supplied to the demodulation unit 31 as a clock signal for demodulation. The clock signal CLK4 is also supplied to an address control circuit 33 so as to control a write address of a first-in first-out (FIFO) memory 34 so that input data D3 is stored in the address designated by the address control circuit 33. Additionally, the clock signal CLK3 generated by the voltage controlled oscillator 32 is supplied to an address control circuit 35. The address control circuit 35 generates and supplies a read address to the FIFO memory 34 in accordance with the clock signal CLK3. Thus the FIFO memory 35 reads out output data D4 at a signal speed corresponding to the frequency of the clock signal CLK3. As mentioned-above, in the demodulator device shown in FIG. 12, a plurality of clock signals are used.

The present invention is not limited to the specifically disclosed embodiments, and variations and modifications may be made without departing from the scope of the present invention.

What is claimed is:

1. A clock signal generating circuit for generating at least one clock signal from a reference clock signal having a predetermined reference frequency, the clock signal generating circuit comprising:

an oscillator generating the reference clock signal;

a counter counting the reference clock signal to divide the reference frequency of the reference clock signal so that a count value output from said counter is reset when the count value reaches a predetermined number;

sine-wave data generating means for outputting sine-wave data of a sine-wave when the count value is input, a set of the sine-wave data being output for successive numbers of the count value from zero to the predetermined number, the set of the sine-wave data corresponding to a predetermined number of waves of the sine-wave;

a digital-to-analog converter converting the set of the sine-wave data into an analog sine-wave signal;

a filter selectively filtering a predetermined frequency component contained in the analog sine-wave signal output from said digital-to-analog converter;

a comparator converting the analog sine-wave signal output from said filter into said at least one clock signal; and wherein said predetermined number of the count value and the predetermined number of waves are changed by a switch signal provided by an external device.

2. A clock signal generating circuit for generating at least one clock signal from a reference clock signal having a predetermined reference frequency, the clock signal generating circuit comprising:

an oscillator generating the reference clock signal;

a counter counting the reference clock signal to divide the reference frequency of the reference clock signal so that a count value output from said counter is reset when the count value reaches a predetermined number;

sine-wave data generating means for outputting sine-wave data of a sine-wave when the count value is input, a set of the sine-wave data being output for successive numbers of the count value from zero to the predetermined number, the set of the sine-wave data corresponding to a predetermined number of waves of the sine-wave;

a digital-to-analog converter converting the set of the sine-wave data into an analog sine-wave signal;

a filter selectively filtering a predetermined frequency component contained in the analog sine-wave signal output from said digital-to-analog converter;

a comparator converting the analog sine-wave signal output from said filter into said at least one clock signal;

cosine-wave data generating means for outputting cosine-wave data of a cosine-wave when the count value is input, a set of the cosine-wave data being output for successive numbers of the count value from zero to the predetermined number, the set of the cosine-wave data corresponding to a predetermined number of waves of the cosine-wave;

a second digital-to-analog converter converting the set of the cosine-wave data into an analog cosine-wave signal;

a second filter selectively filtering a predetermined frequency component of the analog cosine-wave signal output from said second digital-to-analog converter; and a second comparator converting the analog sine-wave signal output from said second filter into the clock signal.

3. The clock signal generating circuit as claimed in claim 2, wherein said sine-wave data generating means stores the set of the sine-wave data as table information so that each sine-wave data is designated by a corresponding count value output from said counter.

4. The clock signal generating circuit as claimed in claim 2, wherein said cosine-wave data generating means stores the set of the cosine-wave data as table information so that each cosine-wave data is designated by a corresponding count value output from said counter.

5. The clock signal generating circuit as claimed in claim 2, wherein said filter and said second filter eliminate a folding frequency component of the analog sine-wave signal and the analog cosine-wave signal, respectively.

6. The clock signal generating circuit as claimed in claim 2, wherein said filter and said second filter selectively extract a folding frequency component of the analog sine-wave signal and the analog cosine-wave signal, respectively.

7. The clock signal generating circuit as claimed in claim 2, wherein said predetermined number of the counter value and the predetermined number of waves are changed by a switch signal supplied by an external device.

8. A clock signal generating circuit for generating at least one clock signal from a reference clock signal having a predetermined reference frequency, the clock signal generating circuit comprising:

an oscillator generating the reference clock signal;

a counter counting the reference clock signal to divide the reference frequency of the reference clock signal so that a count value output from said counter is reset when the count value reaches a predetermined number;

sine-wave data generating means for outputting sine-wave data of a sine-wave when the count value is input, a set of the sine-wave data being output for successive numbers of the count value from zero to the predetermined number, the set of the sine-wave data corresponding to a predetermined number of waves of the sine-wave;

a digital-to-analog converter converting the set of the sine-wave data into an analog sine-wave signal;

a filter selectively filtering a predetermined frequency component contained in the analog sine-wave signal output from said digital-to-analog converter;

a comparator converting the analog sine-wave signal output from said filter into said at least one clock signal;

second sine-wave data generating means for outputting second sine-wave data of a second sine-wave when the count value is input a set of the second since-wave data being output for successive numbers of the count value from zero to the predetermined number, the set of the second since-wave data corresponding to a predetermined number of waves of the second sine-wave;

a second digital-to-analog converter converting the set of the second sine-wave data into a second analog sine-wave signal;

a second filter selectively filtering a predetermined frequency component of the second analog sine-wave signal output from said second digital-to-analog converter;

a second comparator converting the second analog sine-wave signal output from said second filter into a second clock signal; and offset adding means for adding an offset value to the count value input to said second sine-wave data generating means.

9. The clock signal generating circuit as claimed in claim 8, wherein said sine-wave data generating means stores the set of the sine-wave data as table information so that each sine-wave data is designated by a corresponding count value output from said counter.

10. The clock signal generating circuit as claimed in claim 8, wherein said second sine-wave data generating means stores the set of the second sine-wave data as table information so that each second sine-wave data is designated by a corresponding count value output from said counter.

11. The clock signal generating circuit as claimed in claim 8, wherein said filter and said second filter eliminate a folding frequency component of the analog sine-wave signal and the second analog sine-wave signal, respectively.

12. The clock signal generating circuit as claimed in claim 8, wherein said filter and second filter selectively extract a folding frequency component of the analog sine-wave signal and the second analog sine-wave signal, respectively.

13. The clock signal generating circuit as claimed in claim 8, wherein said predetermined number of the count value and the predetermined number of waves are changed by a switch signal provided by an external device.

* * * * *

UNITED STATES PATENT AND TRADEMARK OFFICE
CERTIFICATE OF CORRECTION

PATENT NO. : 6,057,715
DATED : May 2, 2000
INVENTOR(S) : Toshio KAWASAKI

It is certified that error appears in the above-identified patent and that said Letters Patent is hereby corrected as shown below:

On the title page, under "Foreign Patent Documents" insert --2,116,795 09/1983 Great Britain--.

Signed and Sealed this

Sixth Day of March, 2001

Attest:

NICHOLAS P. GODICI

*Attesting Officer*     *Acting Director of the United States Patent and Trademark Office*